United States Patent
Domoto et al.

(10) Patent No.: US 10,443,149 B2
(45) Date of Patent: Oct. 15, 2019

(54) METHOD OF PRODUCING CRYSTAL

(71) Applicant: KYOCERA Corporation, Kyoto-shi, Kyoto (JP)

(72) Inventors: Chiaki Domoto, Kyoto (JP); Yutaka Kuba, Kyoto (JP); Katsuaki Masaki, Kyoto (JP); Yuuichiro Hayashi, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/114,751

(22) PCT Filed: Jan. 29, 2015

(86) PCT No.: PCT/JP2015/052520
§ 371 (c)(1),
(2) Date: Jul. 27, 2016

(87) PCT Pub. No.: WO2015/115543
PCT Pub. Date: Aug. 6, 2015

(65) Prior Publication Data
US 2016/0340795 A1    Nov. 24, 2016

(30) Foreign Application Priority Data
Jan. 29, 2014 (JP) ................................. 2014-014102

(51) Int. Cl.
*C30B 9/06* (2006.01)
*C30B 19/10* (2006.01)
(Continued)

(52) U.S. Cl.
CPC ............... *C30B 19/10* (2013.01); *C30B 9/06* (2013.01); *C30B 15/14* (2013.01); *C30B 19/04* (2013.01);
(Continued)

(58) Field of Classification Search
CPC .............. C30B 9/06; C30B 9/04; C30B 29/36
See application file for complete search history.

(56) References Cited

U.S. PATENT DOCUMENTS 3,053,635 A * 9/1962 Shockley ................ C30B 29/36
117/36
3,353,914 A * 11/1967 Pickar, Jr. ............... C30B 15/00
423/345
(Continued)

FOREIGN PATENT DOCUMENTS

EP          1498518 A1 * 1/2005 ............. C30B 11/00
JP        H07-172998 A      7/1995
(Continued)

OTHER PUBLICATIONS

Office Action dated May 2, 2017 issued in counterpart Japanese Application No. 2016-141548.

*Primary Examiner* — Matthew J Song
(74) *Attorney, Agent, or Firm* — Procopio Cory Hargreaves and Savitch LLP

(57) ABSTRACT

A method of producing a crystal includes a step of preparing a solution containing carbon and a silicon solvent, and a seed crystal of silicon carbide; a step of contacting a lower face of the seed crystal with the solution; a step of raising a temperature of the solution to a first temperature zone; a step of relatively elevating the seed crystal with respect to the solution in a state where a temperature of the solution is being lowered from the first temperature zone to a second temperature zone; a step of raising a temperature of the solution from the second temperature zone to the first temperature zone; and a step of relatively elevating the seed crystal with respect to the solution in a state where a temperature of the solution is being lowered from the first temperature zone to the second temperature zone.

11 Claims, 2 Drawing Sheets

(51) Int. Cl.
   *C30B 15/14* (2006.01)
   *C30B 29/36* (2006.01)
   *C30B 19/04* (2006.01)
   *C30B 19/06* (2006.01)
   *C30B 19/08* (2006.01)
   *C30B 19/12* (2006.01)
(52) U.S. Cl.
   CPC ............ *C30B 19/062* (2013.01); *C30B 19/08* (2013.01); *C30B 19/12* (2013.01); *C30B 29/36* (2013.01)

(56) References Cited

U.S. PATENT DOCUMENTS

| | | | |
|---|---|---|---|
| 2005/0183657 A1* | 8/2005 | Kusunoki | C30B 29/36 117/2 |
| 2013/0305982 A1* | 11/2013 | Hong | C30B 17/00 117/33 |
| 2014/0299046 A1* | 10/2014 | Domoto | C30B 19/04 117/30 |

FOREIGN PATENT DOCUMENTS

| | | |
|---|---|---|
| JP | 2004-002173 A | 1/2004 |
| JP | 2009-091222 A | 4/2009 |
| JP | 2010-184849 A | 8/2010 |
| JP | 2011-251881 A | 12/2011 |
| JP | 2012-162439 A | 8/2012 |
| JP | 2013-075771 A | 4/2013 |
| JP | 2013-540094 A | 10/2013 |
| WO | 2013/062130 A1 | 5/2013 |

\* cited by examiner

METHOD OF PRODUCING CRYSTAL

TECHNICAL FIELD

The present invention relates to a method of producing a silicon carbide crystal.

BACKGROUND ART

In the related art, it has been known that a silicon carbide (SiC) crystal is grown on a lower face of a seed crystal of silicon carbide by a solution technique employing a solution containing carbon (C) and silicon (Si). For example, Japanese Unexamined Patent Publication JP-A 2010-184849 describes that a melt used in the solution technique is maintained at a constant temperature during the growth of the crystal.

In such a production method, since the melt is maintained at a constant temperature during the growth of the silicon carbide crystal, there has been caused a problem that improvement in the growth rate of the silcon carbide crystal is difficult.

The invention has been devised in order to resolve such a problem. An object of the invention is to improve the growth rate of a silicon carbide crystal in a solution technique so as to improve the production efficiency of a silicon carbide crystal.

SUMMARY OF INVENTION

According to one embodiment of the invention, a method of producing a crystal, in the method a silicon carbide crystal being grown on a lower face of a seed crystal of silicon carbide by a solution technique, the method including: a preparation step of preparing a solution obtained by dissolving carbon in a silicon solvent, and a seed crystal of silicon carbide; a contact step of bringing a lower face of the seed crystal into contact with the solution; a crystal growth initiation step of raising a temperature of the solution to a first temperature zone within a temperature range where the silicon solvent remains liquefied and thereby initiating growth of silicon carbide crystal on the lower face of the seed crystal; a first crystal growth step of, after the crystal growth initiation step, relatively elevating the seed crystal with respect to the solution in a state where the temperature of the solution is being lowered from the first temperature zone to a second temperature zone within a temperature range where the silicon solvent remains liquefied, and thereby growing the silicon carbide crystal; a solution temperature raising step of raising the temperature of the solution from the second temperature zone to the first temperature zone; and a second crystal growth step of, after the solution temperature raising step, relatively elevating the seed crystal with respect to the solution in a state where the temperature of the solution is being lowered from the first temperature zone to the second temperature zone and thereby achieving subsequent growth of the silicon carbide crystal.

According to the method of producing a crystal according to one embodiment of the invention, at the first crystal growth step and the second crystal growth step, crystal growth is performed in a state where the temperature of the solution is being lowered. Thus, a degree of supersaturation of the solution is increased and hence the crystal growth rate can be improved. This improves the production efficiency of the crystal.

DESCRIPTION OF EMBODIMENTS

<Crystal Production Apparatus>

Figure 1:
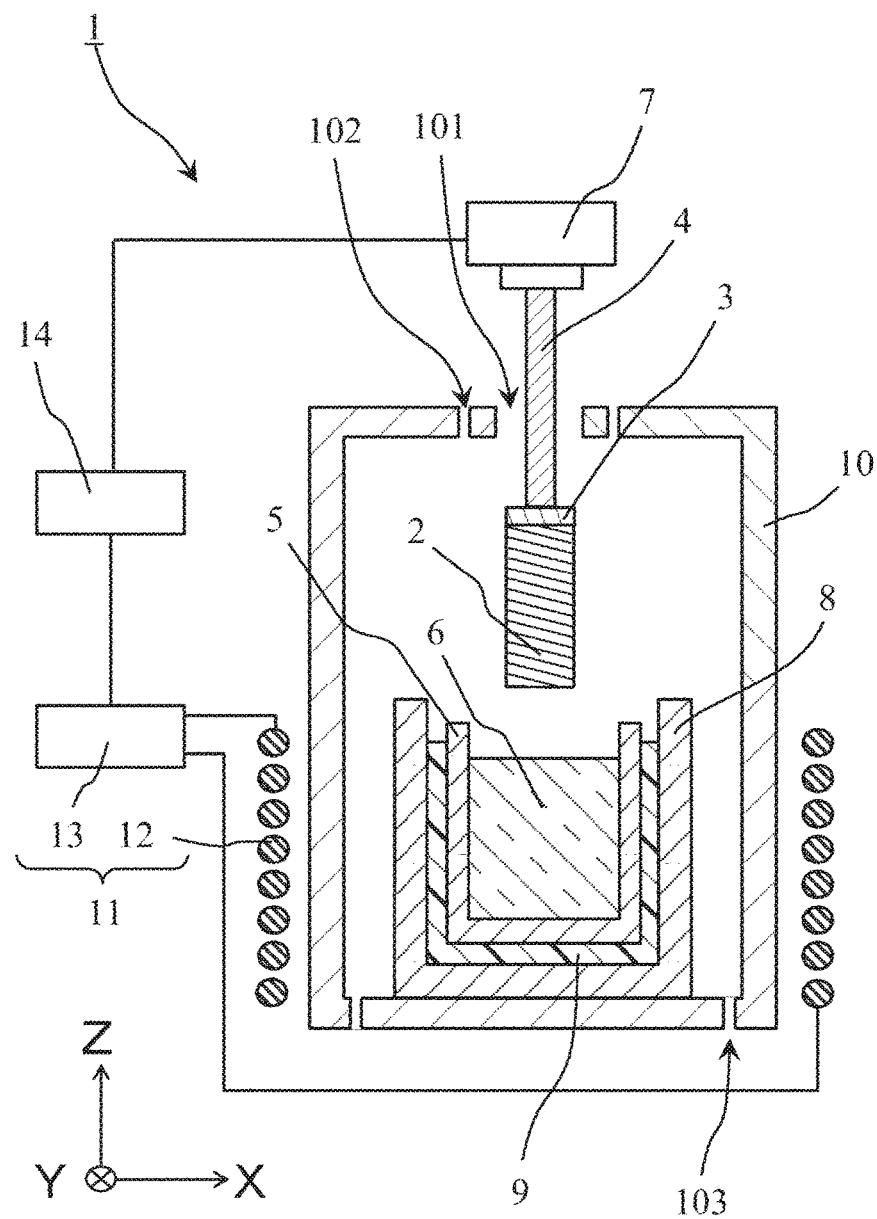
FIG. 1 is a sectional view schematically showing outlines of an example of a crystal production apparatus employed in a method of producing a crystal according to one embodiment of the invention.

With reference to FIG. 1, the present embodiment is described below for an example of a crystal production apparatus employed in a method of producing a crystal according to one embodiment of the invention is described below. FIG. 1 shows outlines of an example of a crystal production apparatus. Here, the invention is not limited to the present embodiment and hence various changes, improvements, and the like are possible without departing from the scope of the invention.

A crystal production apparatus 1 is an apparatus for producing a crystal 2 of silicon carbide used in semiconductor components or the like. The crystal production apparatus 1 grows a crystal 2 on the lower face of a seed crystal 3 so as to produce the crystal 2. As shown in FIG. 1, the crystal production apparatus 1 mainly includes a holding member 4 and a crucible 5. Then, the seed crystal 3 is fixed to the holding member 4 and a solution 6 is contained in the crucible 5. The crystal production apparatus 1 brings the lower face of the seed crystal 3 into contact with the solution 6 so that the crystal 2 is grown on the lower face of the seed crystal 3.

After the production, for example, the crystal 2 is processed into wafers and then each wafer is formed into a part of a semiconductor component by a semiconductor component production process. The crystal 2 is a lump of silicon carbide crystal grown on the lower face of the seed crystal 3. For example, the crystal 2 is formed in a plate-like shape or a columnar shape whose planar shape is circular or polygonal when viewed in a sectional view. Preferably, the crystal 2 is composed of a single silicon carbide crystal. For example, the diameter or width of the crystal 2 to be grown is set to be 25 mm or greater and 200 mm or smaller. Further, for example, the height is set to be 30 mm or greater and 300 mm or smaller.

The seed crystal 3 serves as a seed of the crystal 2 to be grown by the crystal production apparatus 1. For example, the seed crystal 3 is formed in a flat-plate shape whose planar shape is circular or polygonal. The seed crystal 3 is composed of the same material as the crystal 2. That is, since the crystal 2 of silicon carbide is produced in the present embodiment, the seed crystal 3 composed of a silicon carbide crystal is employed. The seed crystal 3 is composed of a single crystal or a polycrystal. In the present embodiment, the seed crystal 3 is composed of a single crystal.

The seed crystal 3 is fixed to the lower face of the holding member 4. For example, the seed crystal 3 is fixed to the holding member 4 by using a bonding material (not shown) containing carbon. Further, the seed crystal 3 can be moved in up and down directions by the holding member 4.

The holding member 4 holds the seed crystal 3 and carries the seed crystal 3 into and out of the solution 6. Specifically, the carrying in and out indicates that the holding member 4 has a function of bringing the seed crystal 3 into contact with the solution 6 and taking the crystal 2 away from the solution 6. As shown in FIG. 1, the holding member 4 is fixed to a moving mechanism (not shown) of the moving device 7. The moving device 7 includes the moving mechanism for moving the holding member 4 fixed to the moving device 7 in the up and down directions by means of a motor or the like. As a result, the holding member 4 is moved in the up and down directions by the moving device 7 so that the seed crystal 3 is moved in the up and down directions in association with the movement of the holding member 4.

For example, the holding member 4 is formed in a columnar shape. For example, the holding member 4 is formed of a carbon polycrystalline material or a fired material obtained by firing carbon. The holding member 4 may be fixed to the moving device 7 in a state of being rotatable about an axis passing through the center part of the planar shape of the holding member 4 so as to extend in the up and down directions. That is, the holding member 4 may be rotatable about its own axis.

The solution 6 is accumulated (contained) in the inside of the crucible 5 and has a function of supplying a raw material for the crystal 2 to the seed crystal 3, for the purpose of growing the crystal 2. The solution 6 contains the same material as the crystal 2. That is, since the crystal 2 is a silicon carbide crystal, the solution 6 contains carbon and silicon. In the present embodiment, the solution 6 is obtained such that carbon serving as a solute is dissolved in a silicon solvent. Here, for the purpose of improving the carbon solubility, for example, the solution 6 may contain as add-in materials one or two or more of metallic materials selected from neodymium (Nd), aluminum (Al), tantalum (Ta), scandium (Sc), chromium (Cr), zirconium (Zr), nickel (Ni), and yttrium (Y).

The crucible 5 is intended for containing the solution 6. Further, the crucible 5 serves as a container in the inside of which the raw material for the crystal 2 is melted. The crucible 5 is formed of a material containing carbon. Specifically, for example, the crucible 5 is formed of graphite. In the present embodiment, silicon is melted in the inside of the crucible 5 and then a part (carbon) of the crucible 5 is dissolved into the melted silicon so that the solution 6 is obtained. For the purpose of storing the solution 6, for example, the crucible 5 is formed in a concave shape having an opening in the upper face.

In the present embodiment, the solution technique is employed as a method of growing the crystal 2 of silicon carbide. In the solution technique, control is performed such that in a state where the solution 6 is maintained in a metastable state (a state remarkably close to a stable state where deposition and elution of the crystal are thermodynamically balanced with each other) on the lower face of the seed crystal 3, the temperature of the seed crystal 3 is lowered or any other method is employed so that a condition is obtained that the deposition of the crystal 2 progresses slightly faster than the elution, and thereby the crystal 2 is grown on the lower face of the seed crystal 3. That is, in the solution 6, carbon (a solute) is dissolved in silicon (a solvent) and then the carbon solubility increases with increasing temperature of the solvent. Here, at the time that the solution 6 heated into a high temperature goes into contact with the seed crystal 3 so as to be cooled, the dissolved carbon goes into a supersaturated state and hence the solution 6 goes into a metastable state locally in the vicinity of the seed crystal 3. Then, in order to bring the solution 6 into a stable state (a thermodynamic equilibrium), the carbon is deposited in the form of the crystal 2 of silicon carbide onto the lower face of the seed crystal 3. As a result, the crystal 2 is grown on the lower face of the seed crystal 3.

The crucible 5 is disposed in the inside of a crucible container 8. The crucible container 8 has a function of holding the crucible 5. A heat retaining material 9 is disposed between the crucible container 8 and the crucible 5. The heat retaining material 9 encompasses the surroundings of the crucible 5. The heat retaining material 9 suppresses heat release from the crucible 5 and brings the temperature distribution in the crucible 5 close to being uniform. The crucible 5 may be disposed in the inside of the crucible container 8 in a state of being rotatable about an axis passing through the center part of the bottom face of the crucible 5 so as to extend in the up and down directions. That is, the crucible 5 may be rotatable.

The crucible container 8 is disposed in the inside of a chamber 10. The chamber 10 separates the space for growing the crystal 2 from the outside atmosphere. Since the chamber 10 is provided, it is possible to reduce a situation that excessive impurities are mixed into the crystal 2. The atmosphere in the inside of the chamber 10 is filled with an inert gas. By virtue of this, the inside of the chamber 10 can be shut off from the outside. Here, the crucible container 8 may be supported by the bottom face of the chamber 10. Alternatively, the bottom face of the crucible container 8 may be supported by a support shaft (not shown) passing from this bottom face through the bottom part of the chamber 10 so as to extend downward.

The chamber 10 includes: a pass hole 101 through which the holding member 4 passes; a gas supply hole 102 which supplies gas into the chamber 10; and a gas discharge hole 103 which discharges the gas from the inside of the chamber 10. Then, the crystal production apparatus 1 includes gas supply means (not shown) which supplies the gas to the inside of the chamber 10. Thus, by virtue of the gas supply means, the gas is supplied through the gas supply hole 102 to the inside of the chamber 10 and then discharged through the gas discharge hole 103.

For example, the chamber 10 is formed in a cylindrical shape. In the chamber 10, the bottom face has a circular shape having a diameter of, for example, 150 mm or greater and 1000 mm or smaller and the height is set to be, for example, 500 mm or greater and 2000 mm or smaller. For example, the chamber 10 is formed of a material such as stainless steel and insulating quartz. Further, for example, the inert gas supplied to the inside of the chamber 10 may be argon (Ar), helium (He), or the like.

The crucible 5 is heated by a heating device 11. The heating device 11 of the present embodiment includes a coil 12 and an alternating current power supply 13 so as to heat the crucible 5, for example, by an induction heating method employing electromagnetic waves. Here, for example, the heating device 11 may employ another method like a method that heat generated by a heat-generating resistor of carbon or the like is transferred. When a heating device of this heat transfer method is adopted, the heat-generating resistor is disposed (between the crucible 5 and the heat retaining material 9).

The coil 12 is formed of a conductor and encompasses the surroundings of the crucible 5. Specifically, the coil 12 is disposed in the surroundings of the chamber 10 so as to encompass the crucible 5 in a cylindrical manner. The heating device 11 provided with the coil 12 has a heating zone of cylindrical shape formed by the coil 12. Here, in the present embodiment, the coil 12 is disposed in the surroundings of the chamber 10. Instead, the coil 12 may be located on the inner side of the chamber 10.

The alternating current power supply 13 is intended for supplying an alternating current through the coil 12. When the electric current flows through the coil 12 so that an electric field is generated, an induced current is generated in the crucible container 8 located in the inside of the electric field. The crucible container 8 is heated by a Joule heat caused by the induced current. Then, the heat of the crucible container 8 is transferred through the heat retaining material 9 to the crucible 5 so that the crucible 5 is heated. When the frequency of the alternating current is adjusted so that the induced current may easily be generated in the crucible container 8, the heating time necessary for the inside of the crucible 5 rising to a setting temperature can be reduced or, alternatively, the power efficiency can be improved.

In the present embodiment, the alternating current power supply 13 and the moving device 7 are connected to and controlled by a control device 14. That is, in the crystal production apparatus 1, the heating and the temperature control of the solution 6 and the carrying in and out for the seed crystal 3 are controlled in a linked manner to each other by the control device 14. The control device 14 includes a central processing unit and a storage device such a memory and is constructed from a publicly known computer or the like.

<Method of Producing Crystal>

Figure 2:
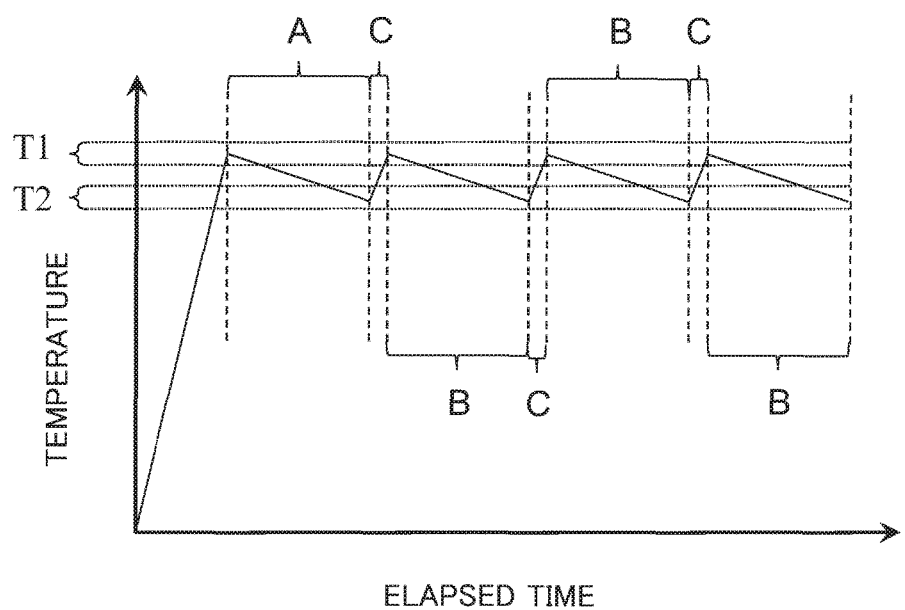
FIG. 2 is a graph showing outlines of a relationship between elapsed time and solution temperature in the method of producing a crystal according to one embodiment of the invention.

A method of producing a crystal according to one embodiment of the invention is described below with reference to FIG. 2. Here, FIG. 2 is a diagram used for describing the method of producing a crystal according to the present embodiment. Specifically, this figure is a graph showing outlines of temperature change in the solution 6 at the time of crystal production, where the horizontal axis indicates the elapsed time and the vertical axis indicates the temperature.

The method of producing a crystal includes mainly a preparation step. a contact step, a crystal growth initiation step, a first crystal growth step, a solution temperature raising step, a second crystal growth step, and a pull-apart step. Here, the invention is not limited to the present embodiment and hence various changes, improvements, and the like are possible without departing from the scope of the invention.

(Preparation Step)

A seed crystal 3 is prepared. For example, the employed seed crystal 3 is obtained so that a lump of silicon carbide crystal produced by a sublimation technique, a solution technique, or the like is formed into a flat-plate shape. In the present embodiment, a crystal 2 having been grown in the same production process is employed as the seed crystal 3. As a result, the seed crystal 3 and the crystal 2 grown on the surface of the seed crystal 3 have compositions close to each other, and hence it is possible to reduce occurrence of dislocations or the like in the crystal 2 which could be caused by a difference in the compositions. Here, the processing into a flat-plate shape may be achieved by cutting the lump of silicon carbide by machining or the like.

The holding member 4 is prepared together with the seed crystal 3 and then the seed crystal 3 is fixed to the lower face of the holding member 4. Specifically, after the holding member 4 is prepared, a bonding material containing carbon is applied to the lower face of the holding member 4. Then, the seed crystal 3 is disposed on the lower face of the holding member 4 via the bonding material so that the seed crystal 3 is fixed to the lower face of the holding member 4. Here, in the present embodiment, after the seed crystal 3 is fixed to the holding member 4, the upper end of the holding member 4 is fixed to the moving device 7. The fixing to the moving device 7 is performed in a manner that as described above, the holding member 4 is rotatable about an axis passing through the center part of the holding member 4 so as to extend in the up and down directions.

The crucible 5 and the solution 6 obtained by dissolving carbon in a silicon solvent and then contained in the crucible 5 are prepared. Specifically, first, the crucible 5 is prepared. Then, silicon particles serving as a raw material for silicon is put in the crucible 5 and then the crucible 5 is heated at or above the melting point (1420° C.) of silicon. At that time, the carbon (a solute) constituting the crucible 5 is dissolved into the silicon (a solvent) having been melted and liquefied. As a result, the solution 6 obtained by dissolving carbon in a silicon solvent can be prepared in the crucible 5. Here, in order to contain carbon in the solution 6, carbon particles may be added in advance as a raw material and then the carbon may be dissolved at the same time as the melting of silicon particles.

Then, the crucible 5 is contained in the inside of the chamber 10. In the present embodiment, the crucible 5 is disposed in the inside of the chamber 10 encompassed by the coil 12 of the heating device 11 and is contained in the crucible container 8 via the heat retaining material 9. Here, the preparation of the solution 6 may be achieved such that the crucible 5 is contained in the inside of the chamber 10 and then the crucible 5 is heated by the heating device 11. Further, the crucible 5 may be heated in advance in the outside of the crystal production apparatus 1 so that the solution 6 may be formed and, after that, the crucible 5 may be contained in the inside of the chamber 10. Further, the solution 6 may be formed in a container or the like other than the crucible 5 and, after that, the solution 6 may be poured into the crucible 5 installed in the inside of the chamber 10.

(Contact Step)

The lower face of the seed crystal 3 is brought into contact with the solution 6. When the holding member 4 is moved downward, the lower face of the seed crystal 3 goes into contact with the solution 6. Here, in the present embodiment, the seed crystal 3 is moved downward so that the seed crystal 3 is brought into contact with the solution 6. Instead, the crucible 5 may be moved upward so that the lower face of the seed crystal 3 may be brought into contact with the solution 6.

In the seed crystal 3, it is sufficient that at least the lower face of the seed crystal 3 is in contact with the surface of the solution 6. Thus, the seed crystal 3 may be disposed in the inside of the solution 6 so that the side face or the upper face of the seed crystal 3 together with the lower face may be brought into contact with the solution 6.

(Crystal Growth Initiation Step)

The temperature of the solution 6 is raised to a first temperature zone T1 so that growth of the crystal 2 of silicon carbide is initiated on the lower face of the seed crystal 3. The first temperature zone T1 is set to be a temperature range where the silicon solvent remains liquefied. For example, the temperature range of the first temperature zone T1 is set to be 1700° C. or higher and 2100° C. or lower.

As a method of measuring the temperature of the solution 6, for example, a method of direct measurement by using a thermocouple or a method of indirect measurement by using a radiation thermometer may be employed. In a case where fluctuation occurs in the temperature of the solution 6, for example, measurement may be performed plural times within a fixed time and then the obtained temperature values may be averaged so that the average temperature may be adopted as the temperature of the solution 6.

The contact of the seed crystal 3 with the solution 6 may be performed after the temperature of the solution 6 has risen to the first temperature zone T1. In a case where the seed crystal 3 is brought into contact with the solution 6 after the temperature has risen, dissolution of the seed crystal 3 posterior to the first crystal growth step can be reduced and hence the production efficiency of the crystal 2 can be improved.

On the other hand, the seed crystal 3 may be brought into contact with the solution 6 before the temperature of the solution 6 has risen to the first temperature zone T1. By virtue of this, for example, the surface of the seed crystal 3 can be dissolved by the solution 6 so that dusts or the like having adhered to the surface of the seed crystal 3 can be removed. This improves the quality of the crystal 2 grown on the surface of the seed crystal 3.

(First Crystal Growth Step)

On the lower face of the seed crystal 3 in contact with the solution 6, the crystal 2 is grown from the solution 6. The growth of the crystal 2 occurs as follows. First, a temperature difference occurs between the lower face of the seed crystal 3 and the solution 6 in the vicinity of the lower face of the seed crystal 3. Then, by virtue of the temperature difference between the seed crystal 3 and the solution 6, when the carbon dissolved in the solution 6 becomes a supersaturated state, the carbon and the silicon in the solution 6 are deposited as the crystal 2 of silicon carbide onto the lower face of the seed crystal 3 so that the crystal 2 is grown. Here, it is sufficient that the crystal 2 is grown at least on the lower face of the seed crystal 3. However. the crystal 2 may be grown on the lower face and the side face of the seed crystal 3.

When the seed crystal 3 is relatively elevated with respect to the solution 6, the crystal 2 can be grown in a plate-like shape or a columnar shape. At that time, when the seed crystal 3 is elevated slowly in the upward direction in a manner that the planar directional and downward growth rates of the crystal 2 are adjusted, the crystal 2 can be grown in a state where the width or the diameter is maintained. For example, the elevation rate of the seed crystal 3 may be set to be 50 μm/h or higher and 2000 μm/h or lower. Here, in the first crystal growth step, for example, the growth time of the crystal 2 is set to be 10 hours or longer and 150 hours or shorter.

As shown in FIG. 2, the elevation of the seed crystal 3 is performed in a state where the temperature of the solution 6 is being lowered from the first temperature zone T1 to a second temperature zone T2. Here, for example, in a case where the solution 6 is maintained at a constant temperature at the time of growth of the crystal 2, a problem arises that the degree of carbon supersaturation in the solution 6 does not easily increase and hence the growth rate of the crystal 2 is not easily improved. In contrast, in the invention, the temperature of the solution 6 is lowered so that the degree of carbon supersaturation in the solution 6 can be increased. As a result, the crystal 2 can easily be deposited from the solution 6 and hence the growth rate of the crystal 2 can be improved. This improves the production efficiency of the crystal 2. Here, in FIG. 2, the first crystal growth step is indicated as "A", the second crystal growth step is indicated as "B", and the solution temperature raising step is indicated as "C".

The second temperature zone T2 is lower than the first temperature zone T1. Further, the second temperature zone T2 is set to be a temperature range where the silicon solvent remains liquefied. For example, the temperature range of the second temperature zone T2 is set to be 1500° C. or higher and 2070° C. or lower. Further, for example, the temperature lowering width of the solution 6 from the first temperature zone T1 to the second temperature zone T2 is set to be 30° C. or greater and 200° C. or smaller. When the temperature lowering width of the solution 6 is set to be 30° C. or greater, the growth rate of the crystal 2 can effectively be improved. On the other hand, when the temperature lowering width of the solution 6 is set to be 200° C. or smaller, a situation can be reduced that the growth condition of the crystal 2 is largely changed so that the quality of the crystal 2 is degraded.

For example, the temperature lowering time of the solution 6 is set to be 10 hours or longer and 150 hours or shorter. When the temperature lowering time of the solution 6 is set to be 10 hours or longer, control of the temperature of the solution 6 can become easy. On the other hand, when the temperature lowering time of the solution 6 is set to be 150 hours or shorter, a situation can be reduced that the degree of carbon supersaturation in the solution 6 becomes excessively low. Thus, a decrease in the growth rate of the crystal 2 can be reduced. Here, in order to lower the temperature of the solution 6, for example, it is sufficient that the output of the heating device 11 for heating the crucible 5 is reduced.

The inclination of the temperature change of the solution 6 may be constant with the elapsed time. In other words, the temperature of the solution 6 may be monotonically lowered. When the temperature of the solution 6 is monotonically lowered, control of the temperature of the solution 6 becomes easy and hence the working efficiency can be improved. In this case, for example, the rate of temperature change for the solution 6 is set to be 1° C./h or higher and 15° C./h or lower. When the rate of temperature change of the solution 6 is set to be 1° C./h or higher, the crystal 2 can easily be grown. Further, when the rate of temperature change of the solution 6 is set to be 15° C./h or lower, occurrence of two-dimensional nuclei in the surface of the crystal 2 can be reduced so that the quality of the crystal 2 can easily be maintained.

On the other hand, the temperature of the solution 6 may be lowered stepwise as time elapses. That is, it is preferable that a step of maintaining the temperature at constant is performed at least once during the first crystal growth step. By virtue of this, for example, the amount of impurities incorporated into the crystal 2 can be changed in accordance with the change of the temperature. As a result, for example, an electrically conductive layer may be formed in the inside of the crystal 2 so that the production efficiency of the subsequent semiconductor components may be improved or, alternatively, a mark of cutting position at the time of processing of the crystal 2 into wafers may be formed.

The temperature of the solution 6 may be lowered in a manner that the degree of carbon supersaturation in the solution 6 may be maintained at constant. As a result, the quality of the crystal 2 can easily be maintained and hence quality degradation in the crystal 2 can be reduced. At that time, with increasing temperature, the saturated carbon concentration in the solution 6 increases and hence the degree of carbon supersaturation tends to decrease. Further, with decreasing temperature, the saturated carbon concentration in the solution 6 decreases and hence the degree of carbon supersaturation tends to increase. Thus, in order to maintain the degree of carbon supersaturation in the solution 6 at constant, the temperature lowering width of the solution 6 becomes great near the first temperature zone T1 and becomes smaller as approaching toward the second temperature zone T2.

Here, specifically, in the solution 6 obtained such that carbon is saturated in an additive-free silicon solvent, for example, with starting from the solution 6 at 2000° C., when the temperature is lowered by 1° C., the degree of carbon supersaturation in the silicon solvent becomes 0.00623 from a thermodynamic calculation. Further, for example, in the solution 6 at 1940° C., in order to set the degree of supersaturation to 0.00623, a temperature decrease of 0.97° C. is required. That is, in order to maintain the degree of supersaturation at constant, the temperature lowering width of the solution 6 near the first temperature zone T1 need be set greater than the temperature lowering width of the solution 6 near the second temperature zone T2.

The temperature of the solution 6 may be lowered in a manner that the amount of carbon supersaturation in the solution 6 may be maintained at constant. As a result, the growth rate of the crystal 2 can easily be maintained at constant so that the productivity can easily be maintained. At that time, with increasing temperature, the saturated carbon concentration in the solution 6 increases and hence the amount of carbon dissolved in the solution 6 increases so that the amount of carbon supersaturation tends to increase. Further, with decreasing temperature, the saturated carbon concentration in the solution 6 decreases and hence the amount of carbon dissolved in the solution 6 decreases so that the amount of carbon supersaturation tends to increase. Thus, in order to maintain the amount of carbon supersaturation in the solution 6 at constant, the temperature lowering width of the solution 6 need be set small near the first temperature zone T1 and need be set greater as approaching toward the second temperature zone T2. Here, specifically, in the solution 6 obtained such that carbon is saturated in an additive-free silicon solvent, for example, with starting from the solution 6 at 2000° C., when the temperature is lowered by 1° C., the amount of carbon supersaturation in the silicon solvent becomes 0.001951 from a thermodynamic calculation. Further, for example, in the solution 6 at 1940° C. in order to set the degree of supersaturation to 0.001951, a temperature decrease of 1.42° C. is required. That is, in order to maintain the amount of supersaturation at constant, the temperature lowering width of the solution 6 near the first temperature zone T1 need be set smaller than the temperature lowering width of the solution 6 near the second temperature zone T2.

In the first crystal growth step, a half or more of the seed crystal 3 or the growing crystal 2 may be located in the outside of the solution 6. By virtue of this, the heat of the seed crystal 3 or the like can be released from the portion the seed crystal 3 or the like located in the outside of the solution 6 so that a large temperature difference can he ensured between the seed crystal 3 or the like and the solution 6. As a result, the growth rate of the crystal 2 can be improved.

In the first crystal growth step, the crystal 2 may be grown in a state where the lower face of the seed crystal 3 or the lower face of the growing crystal 2 is being in contact with the surface of the solution 6. By virtue of this, a large temperature difference can easily be ensured between the seed crystal 3 or the crystal 2 and the solution 6.

On the other hand, in the first crystal growth step, the crystal 2 may be grown in the inside of the solution 6 in a state where the lower face of the seed crystal 3 or the lower face of the crystal 2 is being sunk into the solution 6. When the crystal 2 is grown in the inside of the solution 6 as described above, occurrence of an excessively large temperature difference between the crystal 2 and the solution 6 can be reduced and hence it is possible to reduce quality degradation in the crystal 2 which could be caused by rapid growth of the crystal 2.

The temperature lowering of the solution 6 may be performed in a manner that the temperature of the lower part of the solution 6 becomes lower than the temperature of the upper part of the solution 6. That is, for example, the temperature lowering of the solution 6 may be performed in a manner that the temperature of the bottom part of the crucible 5 becomes lower than the temperature of the wall part of the crucible 5. By virtue of this, the temperature difference in the contact part between the seed crystal 3 and the solution 6 can be increased and hence the growth rate of the crystal 2 can be improved.

Here, when the crucible 5 is located lower relative to the coil 12 of the heating device 11, the temperature of the bottom part of the crucible 5 can be made lower than the temperature of the wall part of the crucible 5. Further, when the position of the heat retaining material 9 disposed between the crucible 5 and the crucible container 8 is moved, the temperature of the bottom part of the crucible 5 can be made lower than the temperature of the wall part of the crucible 5. Further, the holding member 4 may be cooled so that the amount of heat moved from the seed crystal 3 to the holding member 4 may be increased and, thereby, the temperature of the upper part of the solution 6 may be lowered. Further, a cooling member having a lower temperature than the solution 6 may be put into the solution 6 so that the solution 6 may be lowered.

On the other hand, the temperature lowering of the solution 6 may be performed in a manner that the temperature of the upper part of the solution 6 becomes lower than the temperature of the lower part of the solution 6. As such, when the temperature of the solution 6 is lowered, carbon consumed in association with the growth of the crystal 2 can easily be supplied from the bottom part of the crucible 5 to the solution 6. As a result, it is possible to reduce a situation that carbon is supplied from the side part of the crucible 5 and hence the opening width of the crucible 5 is enlarged so that the conditions such as the convection in the solution 6 are changed.

The temperature lowering of the solution 6 may be performed in a manner that the temperature in the solution 6 becomes uniform. As a result, the thermal gradient in the solution 6 can be reduced and hence the degree of supersaturation of the solution 6 can easily be made uniform so that the crystal 2 can easily be grown flat. Here, in the present embodiment, the expression that the temperature in the solution 6 is uniform indicates that the difference between the maximum temperature and the minimum temperature in the inside of the solution 6 is, for example, smaller than 10° C. Further, when the amount of upward movement of the heat in the crucible 5 and the amount of downward movement of the heat are adjusted, the temperature distribution in the solution 6 can easily be made uniform. Here, for example, when the temperatures of the holding member 4 and the support shaft (not shown) are adjusted, the amount of upward or downward movement of the heat in the crucible 5 can be adjusted.

The temperature lowering of the solution 6 may be performed for a fixed time in a manner that the temperature in the solution 6 becomes uniform and, after that, the temperature lowering may be continued in a manner that the temperature of the lower part of the solution 6 becomes lower than the temperature of the upper part of the solution 6. In this case, since the bottom part of the crucible 5 is cooled, for example, miscellaneous crystals generated in the solution 6 can easily adhere to the bottom part of the crucible 5. As a result, a situation can be reduced that miscellaneous crystals are incorporated into the crystal 2. This improves the quality of the crystal 2.

Further, in the first crystal growth step, the crystal 2 may be rotated. When the crystal 2 is rotated, adhesion of miscellaneous crystals generated in the solution 6 onto the crystal 2 can be prevented. As a result, the quality of the crystal 2 can be improved. For example, it is preferable that the rotation of the crystal 2 is set to be 50 rpm or higher and 1000 rpm or lower. Here, the crystal 2 can be rotated by rotating the holding member 4.

Further, in the first crystal growth step, the crucible 5 may be rotated. When the crucible 5 is rotated, a flow of the solution 6 can be generated in the crucible 5 and hence the temperature distribution in the solution 6 can be reduced.

(Solution Temperature Raising Step)

As shown in FIG. 2, the temperature of the solution 6 is raised from the second temperature zone T2 to the first temperature zone T1. By virtue of this, the second crystal growth step described later is allowed to be performed and hence elongation of the crystal 2 can be achieved.

In the present embodiment, for example, the temperature raising of the solution 6 is performed by increasing the output of the heating device 11 in comparison with that at the end of the first crystal growth step. Further, for example, the temperature raising time of the solution 6 is set to be 0.5 hours or longer and 3 hours or shorter. In the solution temperature raising step, for example, the rate of temperature change of the solution 6 is set to be 10° C./h or higher and 600° C./h or lower.

The solution temperature raising step may be performed in a shorter time than the first crystal growth step and the second crystal growth step described later. That is, in the solution temperature raising step, the time of raising the temperature of the solution 6 from the second temperature zone T2 to the first temperature zone T1 may be shorter than the time of lowering the temperature of the solution 6 from the first temperature zone T1 to the second temperature zone T2 in the first crystal growth step and the second crystal growth step. As a result, the overall production time of the crystal 2 can be reduce and hence the production efficiency can be improved.

The crystal 2 may be pulled apart from the solution 6 between the first crystal growth step and the solution temperature raising step and then the crystal 2 may be brought into contact with the solution 6 before the second crystal growth step described later. As such, when the crystal 2 is once pulled apart from the solution 6 so that the temperature of the solution 6 is raised, dissolution of the grown-up crystal 2 into the solution 6 can be reduced and hence the production efficiency of the crystal 2 can be improved.

The pulling apart of the crystal 2 from the solution 6 may be performed after the start of the solution temperature raising step before the start of the second crystal growth step. Here, in the first crystal growth step, when the crystal 2 is grown in a state where the temperature of the solution 6 is being lowered, the growth rate of the crystal 2 is improved. At that time, rapid growth occurs in a portion where growth is easy to occur within the surface of the crystal 2. This causes a tendency that the surface of the crystal 2 becomes coarse. When the growth of the crystal 2 is continued in such a state, this tends to cause a problem that grooves are formed in the grown-up crystal 2. In contrast, in a case where the crystal 2 is pulled apart from the solution 6 after the solution temperature raising step, the surface of the crystal 2 can be dissolved into the solution 6 so that the surface of the crystal 2 can be brought close to being flat. As a result, in the subsequent crystal growth, the influence of the surface state of the crystal grown in the first crystal growth step can be reduced and hence it is possible to reduce the occurrence of a problem that grooves are formed in the grown-up crystal 2. Thus, the quality of the crystal 2 can be improved.

The dissolution of the crystal 2 into the solution 6 may be performed in a state where the lower face of the grown-up crystal 2 is sunk in the solution 6. When the lower face of the crystal 2 is sunk in the solution 6, heat release in the planar direction of the crystal 2 can easily be made uniform and hence the lower face of the crystal 2 can be brought close to being flat.

On the other hand, the dissolution of the crystal 2 into the solution 6 may be performed in a state where the lower face of the grown-up crystal 2 and the surface of the solution 6 are in contact with each other. In this case, the side face of the crystal 2 is easily cooled in comparison with the lower face of the crystal 2 and hence the crystal 2 can be dissolved so that the center part of the lower face of the crystal 2 slightly becomes concave. Thus, when the crystal 2 is grown in a state where a flow of the solution 6 hits the center part of the lower face of the crystal 2, the crystal 2 can be grown in the planar direction so that the depression in the center part is filled up. Thus, the quality of the crystal 2 can be improved.

At the time that the crystal 2 is pulled apart, the crystal 2 may be separated from the solution 6 in a state where the crystal 2 together with the seed crystal 3 is rotated by the holding member 4. By virtue of this, it is possible to reduce a situation that the solution 6 adheres to the surface of the crystal 2. As a result, for example, it is possible to reduce a situation that the solution 6 solidifies so that cracks occur in the crystal 2.

When the crystal 2 has been pulled apart from the solution 6, the crystal 2 may be brought into contact with the solution 6 in the solution temperature raising step. In this case, the surface of the crystal 2 can be dissolved into the solution 6 and hence the surface of the crystal 2 can be brought close to being flat. Further, when the crystal 2 is brought into contact with the solution 6 in the solution temperature raising step, for example, the dissolution amount of the surface of the crystal 2 can be adjusted.

When the crystal 2 is pulled apart from the solution 6, the crystal 2 may be held in a state where the lower face of the crystal 2 is located in the vicinity of the surface of the solution 6. As a result, the lower face of the crystal 2 can be warmed with radiant heat from the solution 6 and hence it is possible to reduce a situation that the solution 6 having adhered to the lower face at the time of pull-apart of the crystal 2 from the solution 6 solidifies.

The solution temperature raising step may be performed in a state where the crystal 2 is in contact with the solution 6. In this case, for example, even when the surface state is remarkably unsatisfactory, the crystal 2 can sufficiently be dissolved by the solution 6 so that the lower face of the crystal 2 can be brought close to being flat. Further, for example, when the crystal 2 is rotated, the solution 6 can be agitated during the temperature raising so that the temperature distribution in the solution 6 can be reduced. Thus, the lower face of the crystal 2 can be brought close to being flat.

In the solution temperature raising step, the temperature of the solution 6 remaining in the first temperature zone T1 may be higher than or equal to the temperature of the solution 6 remaining in the first temperature zone T1 in the time of the crystal growth initiation step or the first crystal growth step. Here, for example, when the growth of the crystal 2 is performed for a long time, the amount of the silicon solvent in the solution 6 decreases and the dissolved carbon content decreases. Thus, the growth rate of the crystal 2 after the solution temperature raising step tends to slow down. In contrast, according to the invention, the temperature of the solution 6 is higher than or equal to the temperature of the solution 6 remaining in the first temperature zone T1 in the first crystal growth step, so that the carbon concentration is increased and thereby the growth rate of the crystal 2 after the solution temperature raising step can be improved.

In the solution temperature raising step, a silicon material may be added to the solution 6. By virtue of this, the silicon having been consumed by crystal growth, evaporation, or the like can be replenished and hence the composition of the solution 6 can easily be maintained in a desired composition. As a result, the quality of the crystal 2 can be improved.

The silicon material to be added to the solution 6 may be in the form of powder. When the powdered silicon material is added to the solution 6, the silicon material can easily be dissolved. Thus, the efficiency of temperature raising of the solution 6 can be improved.

The silicon material to be added to the solution 6 may be in the form of lumps. In this case, for example, because of a larger mass in comparison with the powdered silicon, it is possible to reduce a situation that the material soars high owing to gas convection or the like in the chamber 10. As a result, the work of adding the raw material can efficiently be performed.

When the silicon material is added to the solution 6, the temperature raising of the solution 6 may be started after the addition of the silicon material. By virtue of this, a sufficient time can be ensured before the growth start and hence the composition in the inside of the solution 6 can be stabilized. Thus, the quality of the subsequently grown crystal 2 can easily be maintained.

On the other hand, when the silicon material is added to the solution 6, the silicon material may be added after the temperature raising of the solution 6 has been performed. In this case, the temperature of the solution 6 can easily be lowered and hence the second crystal growth step can easily be started. Thus, the production efficiency of the crystal 2 can be improved.

In the solution temperature raising step, the crystal 2 or the crucible 5 or, alternatively, the crystal 2 and the crucible 5 may be rotated. By virtue of this, circulation of the solution 6 occurs in the inside of the crucible 5. Thus, circulation occurs also in the solution 6 in the vicinity of the contact part between the crystal 2 and the solution 6 and hence the solution 6 at a high temperature can always be supplied to the crystal 2. Thus, the crystal 2 is easily warmed and hence the crystal 2 can easily be dissolved into the solution 6.

On the other hand, in the solution temperature raising step, the crucible 5 may be not rotated. In this case, for example, a flow of the solution 6 different from that in a case where the crystal 2 is rotated can be generated in the inside of the crucible 5. As a result, for example, a flow of the solution 6 different from that in the first crystal growth step is generated so that the solution 6 can be agitated in the inside of the crucible 5.

The inclination of the temperature change of the solution 6 may be constant with the elapsed time. In other words, the temperature of the solution 6 may be monotonically raised. When the temperature of the solution 6 is monotonically raised, control of the temperature of the solution 6 becomes easy and hence the working efficiency can be improved. In this case, for example, the rate of temperature change for the solution 6 is set to be 50° C./h or higher and 500° C./h or lower.

In the solution temperature raising step, the temperature of the solution 6 may be raised stepwise as time elapses. That is, it is preferable that a process of maintaining the temperature at constant is performed at least once in the solution temperature raising step. Further, when the crystal 2 is once pulled apart from the solution 6 in the solution temperature raising step, the temperature of the solution 6 may be raised stepwise and, after that, the crystal 2 may again be brought into contact with the solution 6 in a state where the temperature of the solution 6 is maintained at constant. By virtue of this, the composition in the inside of the solution 6 can be stabilized and hence the dissolution amount of the crystal 2 at the time that the crystal 2 is brought into contact with the solution 6 can easily be adjusted.

The temperature raising of the solution 6 may be performed in a manner that the temperature of the upper part of the solution 6 becomes higher than the temperature of the lower part of the solution 6. That is, for example, the temperature raising of the solution 6 may be performed in a manner that the temperature of the wall part of the crucible 5 becomes higher than the temperature of the bottom part of the crucible 5. By virtue of this, for example, when miscellaneous crystals have adhered to the bottom part of the crucible 5, it is possible to reduce a situation that the crucible 5 is eluted into the solution 6 so that the miscellaneous crystals are separated from the bottom part of the crucible 5 and then incorporated into the crystal 2.

(Second Crystal Growth Step)

As shown in FIG. 2, after the solution temperature raising step, the seed crystal 3 is relatively elevated with respect to the solution 6 in a state where the temperature of the solution 6 is being lowered from the first temperature zone T1 to the second temperature zone T2, so that subsequent growth of the crystal 2 is achieved. By virtue of this, elongation of the crystal 2 can be achieved.

In the second crystal growth step, for example, the elevation rate of the seed crystal 3 may be set to be 50 $\mu$m/h or higher and 2000 $\mu$m/h or lower. For example, the growth of the crystal 2 is performed for 10 hours or longer and 150 hours or shorter. For example, the temperature of the solution 6 is set to be 1500° C. or higher and 2100° C. or lower.

(Pull-apart Step)

After the second crystal growth step, the grown-up crystal 2 is pulled apart from the solution 6 so that the crystal growth is terminated.

The invention is not limited to the embodiment given above and hence various changes, improvements, and the like are possible without departing from the scope of the invention.

In the invention, the solution temperature raising step and the second crystal growth step may be both repeated plural times. Here, for example, when the crystal 2 is performed for a long time, the carbon concentration of the solution 6 decreases and hence the growth rate tends to slow down. In contrast, in a case where the solution temperature raising step and the second crystal growth step are repeated, the degree of carbon supersaturation in the solution 6 can be increased by virtue of the solution temperature raising step so that the growth rate of the crystal 2 in the second crystal growth step can easily be maintained. Here, for example, the solution temperature raising step and the second crystal growth step are repeated 40 times or more and 100 times or less.

The time of the second crystal growth step may be reduced as this step is repeated. For example, when the growth of the crystal 2 is performed for a long time, the heat release from the lower face of the crystal 2 decreases owing to the film thickening and the elongation of the crystal 2 so that the growth rate tends to slow down. In contrast, when the time of the second crystal growth step is gradually reduced, the degree of carbon supersaturation in the solution 6 increases so that the growth rate of the crystal 2 can easily be maintained.

In the second crystal growth step performed repeatedly, in a case where the temperature lowering of the solution 6 is performed by lowering the temperature of the crucible 5, the temperature lowering may be performed on a portion of the crucible 5 different from that used in the preceding second crystal growth step. In this case, when miscellaneous crystals occur in the second crystal growth step, although the miscellaneous crystals easily adhere to a lower temperature portion of the crucible 5, it is possible to suppress a situation that the miscellaneous crystals are accumulated in a portion of the crucible 5, by changing the temperature lowering portion of the crucible 5.

After the first crystal growth step and the second crystal growth step and before the solution temperature raising step, the crystal 2 may be pulled apart from the solution 6 so that the temperature of the solution 6 may be further lowered. In this case, the impurity concentration of the solution 6 can be controlled. That is, for example, when nitrogen is taken into consideration as impurities, with decreasing temperature of the solution 6, the saturated nitrogen concentration increases and hence, for example, nitrogen is easily dissolved into the solution 6 from the gas of the atmosphere. Then, the nitrogen dissolved in the solution 6 is incorporated into the crystal 2. By virtue of this, the incorporated nitrogen serves as dopants so that the crystal 2 of n-type semiconductor can be obtained.

The temperature of the solution 6 in the solution temperature raising step may be increased as this step is repeated. For example, when the growth of the crystal 2 is performed for a long time, the heat release from the lower face of the crystal 2 decreases owing to the film thickening and the elongation of the crystal 2 so that the growth rate tends to slow down. In contrast, when the temperature of the solution 6 in the solution temperature raising step is gradually increased, the saturated carbon concentration in the solution 6 increases so that the growth rate of the crystal 2 can easily be maintained.

A solution temperature maintaining step of maintaining the temperature of the solution 6 within the first temperature zone T1 for a predetermined time may be provided before the crystal growth initiation step. As a result, the composition in the inside of the solution 6 is easily stabilized before the beginning of the first crystal growth step and hence the quality of the crystal 2 can be improved.

Further, the solution temperature maintaining step may be provided between the solution temperature raising step and the second crystal growth step. As a result, the composition in the inside of the solution 6 is easily stabilized before the beginning of the second crystal growth step and hence the quality of the crystal 2 can be improved.

In the solution temperature raising step, the gas supply rate to the growth atmosphere of the crystal 2 may be increased. By virtue of this, impurities inherent in inside of the crystal production apparatus 1 can easily be removed by the gas and hence a situation can be reduced that the impurities are incorporated into the crystal 2.

When the gas supply rate has been increased in the solution temperature raising step, it is preferable that the gas supply rate is reduced before the start of the second crystal growth step. By virtue of this, the conditions of the atmosphere during the growth of the crystal 2 become constant and hence the quality of the crystal 2 can easily be maintained.

In the first crystal growth step and the second crystal growth step, the gas at a fixed supply rate may be supplied to the atmosphere during the growth of the crystal 2. By virtue of this, the temperature conditions and the like of the atmosphere during the growth of the crystal 2 can easily be controlled.

REFERENCE SIGNS LIST

1: Crystal production apparatus
2: Crystal
3: Seed crystal
4: Holding member
5: Crucible
6: Solution
7: Moving device
8: Crucible container
9: Heat retaining material
10: Chamber
101: Pass hole
102: Gas supply hole
103: Gas discharge hole
11: Heating device
12: Coil
13: Alternating current power supply
14: Control device
T1: First temperature zone
T2: Second temperature zone
A: First crystal growth step
B: Second crystal growth step
C: Solution temperature raising step

The invention claimed is:

1. A method of producing a crystal, in the method a silicon carbide crystal being grown on a lower face of a seed crystal of silicon carbide by a solution technique, the method comprising:
   a preparation step of preparing a solution obtained by dissolving carbon in a silicon solvent, and a seed crystal of silicon carbide;
   a contact step of bringing a lower face of the seed crystal into contact with the solution;
   a crystal growth initiation step of raising a temperature of the solution to a first temperature zone within a temperature range where the silicon solvent remains liquefied and thereby initiating growth of silicon carbide crystal on the lower face of the seed crystal;
   a first crystal growth step of, after the crystal growth initiation step, relatively elevating the seed crystal with respect to the solution in a state where a temperature of the solution is being lowered from the first temperature zone to a second temperature zone within a temperature range where the silicon solvent remains liquefied, and thereby growing the silicon carbide crystal;
   a solution temperature raising step of, after the first crystal growth step, raising a temperature of the solution from the second temperature zone to the first temperature zone while increasing a gas supply rate to the growth atmosphere of the crystal; and
   a second crystal growth step of, after the solution temperature raising step, relatively elevating the seed crystal with respect to the solution in a state where a temperature of the solution is being lowered from the first temperature zone to the second temperature zone and thereby achieving subsequent growth of the silicon carbide crystal, wherein the crystal is separated from the solution between the first crystal growth step and the solution temperature raising step, and then the crystal is brought into contact with the solution before the second crystal growth step, and wherein at the solution temperature raising step, the solution is raised to the first temperature zone after a silicon material added to the solution.

2. The method according to claim 1, wherein the solution temperature raising step and the second crystal growth step are both repeated plural times.

3. The method according to claim 1, wherein a temperature of the solution in the first temperature zone of the solution temperature raising step is higher than or equal to a temperature of the solution in the first temperature zone of the first crystal growth step.

4. The method according to claim 1, wherein a time of raising a temperature of the solution from the second temperature zone to the first temperature zone at the solution temperature raising step is shorter than a time of lowering a temperature of the solution from the first temperature zone to the second temperature zone at the first crystal growth step and the second crystal growth step.

5. The method according to claim 1, wherein the contact step is performed before a temperature of the solution is raised to the first temperature zone at the crystal growth initiation step.

6. The method according to claim 1, wherein the crystal is separated from the solution in a state where the crystal is rotated together with the seed crystal.

7. The method according to claim 1, wherein the crystal is brought into contact with the solution in the solution temperature raising step.

8. The method according to claim 1, wherein the solution is contained in a crucible containing carbon after the preparation step.

9. The method according to claim 1, further comprising a solution temperature maintaining step of maintaining a temperature of the solution within the first temperature zone for a predetermined time, after the crystal growth initiation step.

10. The method according to claim 1, wherein the solution temperature maintaining step is performed between the solution temperature raising step and the second crystal growth step.

11. The method according to claim 1, wherein in the solution temperature raising step, the lower face of the crystal is again brought into contact with the solution in a state where a temperature of the solution is maintained at constant for a predetermined time.

* * * * *